(12) United States Patent
Klemm

(10) Patent No.: US 11,169,208 B2
(45) Date of Patent: Nov. 9, 2021

(54) INSPECTION DEVICE

(71) Applicant: DSPACE DIGITAL SIGNAL PROCESSING AND CONTROL ENGINEERING GMBH, Paderborn (DE)

(72) Inventor: Matthias Klemm, Paderborn (DE)

(73) Assignee: DSPACE DIGITAL SIGNAL PROCESSING AND CONTROL ENGINEERING GMBH, Paderborn (DE)

(*) Notice: Subject to any disclaimer, the term of this patent is extended or adjusted under 35 U.S.C. 154(b) by 355 days.

(21) Appl. No.: 16/205,765

(22) Filed: Nov. 30, 2018

(65) Prior Publication Data

US 2019/0107577 A1 Apr. 11, 2019

Related U.S. Application Data

(63) Continuation of application No. PCT/EP2017/060502, filed on May 3, 2017.

(30) Foreign Application Priority Data

May 30, 2016 (DE) .......................... 102016006361.0

(51) Int. Cl.
*G01R 31/28* (2006.01)
*G01R 31/317* (2006.01)
(Continued)

(52) U.S. Cl.
CPC . *G01R 31/31727* (2013.01); *G01R 31/31712* (2013.01); *G05B 19/042* (2013.01);
(Continued)

(58) Field of Classification Search
CPC ........ G01R 31/31727; G01R 31/31712; G05B 19/042; G05B 2219/23446; G05B 2219/25041; G06F 1/08
See application file for complete search history.

(56) References Cited

U.S. PATENT DOCUMENTS 9,369,270 B1 6/2016 Spijker
10,656,203 B1* 5/2020 Kishore ........... G01R 31/31723
(Continued)

FOREIGN PATENT DOCUMENTS

DE 10127293 A1 12/2001
DE 102005039450 B4 4/2008
(Continued)

OTHER PUBLICATIONS

PCT, International Search Report for PCT/EP2017/060502, dated May 30, 2017.
(Continued)

*Primary Examiner* — Christine T. Tu
(74) *Attorney, Agent, or Firm* — Orrick, Herrington & Sutcliffe LLP; Joseph A. Calvaruso; K. Patrick Herman

(57) ABSTRACT

A checking apparatus can test at least one first closed-loop control unit. The checking apparatus can include a first timing transmission unit which can generate a first periodic timing signal from a first time signal, and which can output the first periodic timing signal to a first PLL. The check device can further include a first oscillator which can generate a second periodic timing signal and which can output the second periodic timing signal to a second PLL. The checking device can additionally include a first clock, and can forward a first clock signal to a first input/output unit, and/or to a first computation unit. A first changeover signal can be used to control a first multiplexer such that depending on a state of the first changeover signal, the first multiplexer can forward either a first frequency-stabilized
(Continued)

timing signal or a second frequency-stabilized timing signal to the first clock.

4 Claims, 1 Drawing Sheet

(51) Int. Cl.
*G06F 1/08* (2006.01)
*G05B 19/042* (2006.01)

(52) U.S. Cl.
CPC ...... *G06F 1/08* (2013.01); *G05B 2219/23446* (2013.01); *G05B 2219/25041* (2013.01)

(56) References Cited

U.S. PATENT DOCUMENTS

| | | |
|---|---|---|
| 2005/0200390 A1 | 9/2005 | Starr et al. |
| 2006/0067449 A1 | 3/2006 | Boehl et al. |
| 2006/0197607 A1 | 9/2006 | Castro et al. |
| 2007/0273410 A1 | 11/2007 | Miike |
| 2011/0196641 A1* | 8/2011 | Sawai ................ G06F 11/24 702/117 |
| 2014/0071982 A1 | 3/2014 | Chandhoke et al. |
| 2015/0198663 A1* | 7/2015 | Syed ................ G01R 31/3177 714/726 |
| 2019/0146035 A1* | 5/2019 | Klemm ................ G05B 17/02 702/58 |

FOREIGN PATENT DOCUMENTS

| | | |
|---|---|---|
| EP | 1638243 A2 | 3/2006 |
| KR | 100406863 B1 | 11/2003 |
| WO | WO 96/03679 A1 | 2/1996 |

OTHER PUBLICATIONS

DE, German Search Report for German Patent Application No. 102016006361.0, dated Jul. 10, 2018.

Gehring et al, "A hardware in the loop test bench for the validation of complex ECU Networks", Jul. 7, 2002, pp. 1-19, XP055401072, SAE 2002 World Congress, Detroit, Michigan.

Orolia Group et al., PCI Express Time Code Processor, Technical Specifications for Model TSync-PCIe, Spectracom, Apr. 30, 2014.

TechSAT Gmbh, Data Sheet PDL Sync Portable Data Loader Synchronization Solution, TechSAT, mastering integration complexity, 2015 TechSAT GMBH / Rev-1000.

Dspace Gmbh, Catalog 2015, pp. 1-596 (part I pp. 1-298; part II 299-596).

PCT International Search Report for PCT/EP2017/062970 dated Sep. 25, 2017.

* cited by examiner

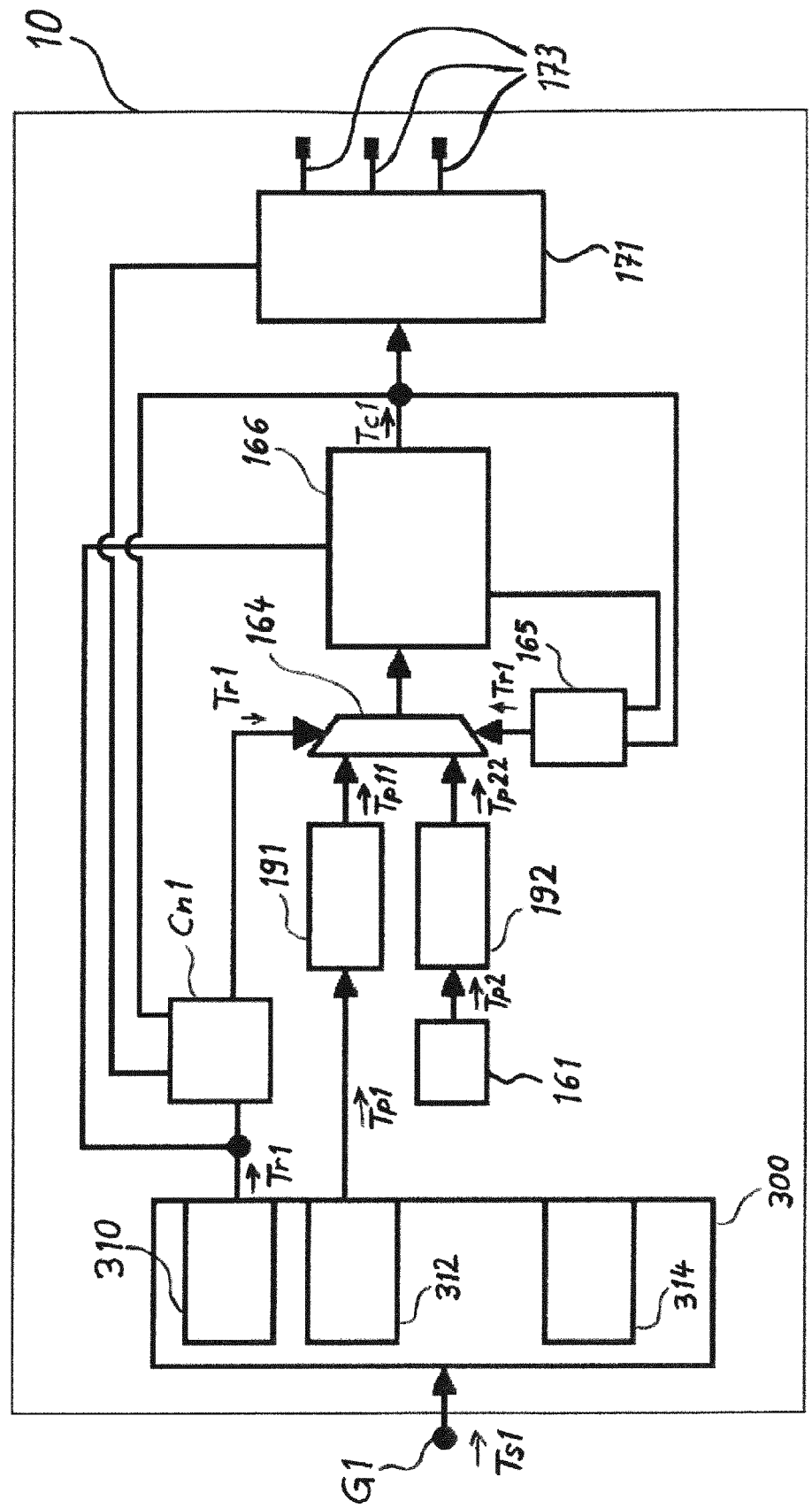

INSPECTION DEVICE

CROSS-REFERENCE TO RELATED APPLICATIONS

This application is a continuation application of International Patent Application No. PCT/EP2017/060502, filed on May 3, 2017, which claims priority to German Patent Application No. 102016006361.0, filed on May 30, 2016, the contents of which are incorporated herein by reference in their entireties and for all purposes.

FIELD OF THE INVENTION

The present disclosure generally relates to a checking apparatus for testing at least one first electronic closed-loop control unit.

BACKGROUND OF THE INVENTION

Frequently, a checking apparatus, for testing at least one first electronic closed-loop control unit, comprises at least one first computation unit and one second computation unit that is physically separate from the first computation unit, the first computation unit having a first executable model code for calculating a first submodel of the controlled system model, and the second computation unit having a second executable model code for calculating a second submodel of the controlled system model.

A published product catalog "Catalog 2015/Embedded Success dSPACE", which is available as a printed catalog, is cited with the reference number "P1" in the text that follows and can be found on the internet at www.dspace.com/de/gmb/home/medien/product_info/catalog_contents.cfm. P1 discloses apparatuses for testing closed-loop control units. In particular P1, pages 296 to 331 and pages 496 to 515, describes apparatuses and parts thereof for the intended use mentioned. Networking of the apparatuses is realizeable, for example, by means of Ethernet interface cards, as in the aforementioned product catalog on pages 472 and 473, for example. Such apparatuses may be configured as what are known as "HIL simulators", the abbreviation "HIL" (hardware in the loop) referring to a closed loop.

As such, there is apparent interest in technologies which are applicable to checking apparatuses.

BRIEF DESCRIPTION OF THE DRAWINGS

FIG. 1 illustrates a schematic view of an example checking apparatus, according to an embodiment of the present disclosure.

DETAILED DESCRIPTION

According to various embodiments of the present disclosure, a checking apparatus can test at least one first closed-loop control unit. The checking apparatus can include a first timing transmission unit which can generate a first periodic timing signal from a first time signal, and which can output the first periodic timing signal to a first PLL. The checking device can further include a first oscillator which can generate a second periodic timing signal and which can output the second periodic timing signal to a second PLL. The checking device can additionally include a first clock. The first clock can be connected to a first multiplexer by means of a timing signal line, and can forward a first clock signal to a first input/output unit, and/or to a first computation unit.

A first multiplexer input of the first multiplexer can be connected to a first PLL output of the first PLL, can transmit a first frequency-stabilized timing signal in the direction of the first multiplexer. Also, a second multiplexer input of the first multiplexer can be connected to a second PLL output of the second PLL, and can transmit a second frequency-stabilized timing signal in the direction of the first multiplexer. Moreover, a first changeover signal can be used to control the first multiplexer such that, depending on a state of the first changeover signal, the first multiplexer can forward either the first frequency-stabilized timing signal or the second frequency-stabilized timing signal to the first clock.

The closed-loop control units cited at the outset are often referred to as controllers, although in the realm of system theory the scope of functions of said closed-loop control units usually goes beyond the "pure" open-loop control function and comprises closed-loop control functions.

The first computation unit of the checking apparatus, which has at least one first microprocessor, is intended and configured to execute a first model code, which realizes at least some of the controlled system simulation, by means of the microprocessor. The model code, together with the hardware of the checking apparatus, replicates the technical environment of an electronic device or of a more complex technical system at least in part. Using the model code, the checking apparatus provides simulated sensor signals for the closed-loop control unit, for example. In addition, the checking apparatus can be used as a controlled current sink for deriving an actuator current provided by the closed-loop control unit, for example.

What is known as HIL simulation is an international technical term, in particular also used in the German-speaking region, for a test method that involves an "embedded system", for example a closed-loop control unit or a mechatronic module, being connected by its inputs and outputs to an adapted counterpart, for example a checking apparatus in the form of an HIL simulator, that is used for replicating the real environment of the embedded system. During the test on the embedded system, at least some of the input signals for the embedded system are thus provided by the HIL simulator, and at least some of the output signals from the embedded system are sent to the HIL simulator.

By way of example, a model code of a controlled system model executed on an HIL simulator can be used to replicate the timing response of the environment of the system to be tested. If, for example, an HIL simulator is meant to test an embedded system, in particular a closed-loop control unit (often shortened to ECU: electronic closed-loop control unit), then the HIL simulator is configured as an at least partial replication of the real environment of the closed-loop control unit. In this case, the HIL simulator can thus use its inputs and outputs, or bidirectional communication channels, to communicate with the controller and can therefore act as an adapted counterpart of the closed-loop control unit.

HIL simulation usually needs to take place in real time. When the technically relevant environment of the closed-loop control unit is simulated, the simulated environment comprising the simulated controlled system, it is in particular possible for such interactions of the closed-loop control unit as can recur in a later real environment of the closed-loop control unit to be replicated in automated fashion and/or in a predefined order. This has the advantage that a new development version of a piece of open-loop or closed-loop control software can be tested under the same criteria as the predecessor version. It is therefore possible to verify in detail whether or not a fault has been rectified (retesting).

Tests on real systems (for example on a brake system or a traction control system of a motor vehicle) can be greatly reduced by means of tests on the HIL simulator, and it is additionally possible for system limits or limits of the controllability of the closed-loop control unit and/or of the controlled system to be ascertained without putting the real system and its users (e.g. automobile and driver) at risk.

HIL simulation is typically a simplification of reality and usually cannot fully replace the test on the real system that more often than not takes place later, for example the test on the interaction of the closed-loop control unit with the "real" controlled system of a controlled prototype and/or the test on the interaction of the closed-loop control unit with a controlled mass-produced product.

It is known practice to use a physically distributed checking apparatus for testing at least one electronic closed-loop control unit, the checking apparatus comprising at least two separate computation units—for example at least two separated and networked simulators. The 2002-published document—subsequently referenced by P2—"A Hardware-in-the-Loop Test Bench for the Validation of Complex ECU Networks", J. Gehring, H. Schütte, dSPACE GmbH, page 3, FIG. 3 of the 2002 document, publication reference "SAE 2002 World Congress Detroit, Mich. Mar. 4-7, 2002" already depicts a checking apparatus configured as a distributed HIL simulator and having multiple computation units, which in this case are configured as a "central unit", engine unit, that is to say "engine", power transmission unit, that is to say "transmission", and combined ESP suspension unit, that is to say "ESP suspension", for example. The computation units are networked to one another via an optical connecting means, that is to say a "high-speed optical link". Page 7, right-hand side, the "Conclusion" section, second list point in the same document, mentions that demands on interprocessor communication can require timestamping and automatic process synchronization.

The document—subsequently referenced by P3—"Hardware-in-the-Loop Technology Enabling Flexible Testing Processes", Andreas Himmler, dSPACE GmbH, page 3, paragraph B., publication reference "$51^{st}$ AIAA Aerospace Sciences Meeting, 2013, Grapevine, Tex., USA" discloses the practice of providing a serial network called IOCNET®, which is based on the physical layer of Gigabit-Ethernet, for HIL simulators, which is able to be used by the interface cards provided for the input and output of signals and data, abbreviated to I/O cards, to interchange data both with one another and with the microprocessor card(s) in real time. For the data interchange between the I/O cards and/or processor cards, which are up to 100 meters apart, for example, it is possible to use what are known as Gigalink modules, as are shown on pages 355 and 361 of the aforementioned document P1, for example. The data transmission media proposed between the I/O cards and/or processor card(s), which are 100 meters apart, for example, in P3, page 3, paragraph B, and in P1, page 349, are a fiber optic cable connection, referred to here as "optical media" or "fiber-optic cable". The aforementioned network IOCNET provides a protocol that supports timing synchronization, in particular for reading in input signals on the interfaces of the I/O cards used; in this regard see document P1, page 299, together with the figure on the same page if applicable.

The aforementioned networking solutions by means of IOCNET® for timing synchronization within a checking apparatus—in particular an HIL simulator—for testing a closed-loop control unit are intended only for a distance between the computation units that only slightly exceeds 100 meters, however.

Closed-loop control units and the control software implemented therein are increasingly being developed in physically distributed work groups. These frequently involve multiple companies at different sites. The software and hardware developers involved therefore frequently require adapted, in particular in-situ-adaptable, checking apparatuses for testing for the purpose of testing the closed-loop control units in the progressive development phases.

There may therefore arise in future a demand for a checking apparatus for testing that, by way of example, comprises a network comprising two or more computation units—for example HIL simulators, these computation units or HIL simulators being at different sites, the sites possibly being at a distance from one another of significantly more than 100 meters.

In practical application, closed-loop control units are very frequently networked to further closed-loop control units. By way of example, motor vehicles having more than 40 closed-loop control units are not uncommon, some of the closed-loop control units being able to ensure the respectively associated scope of functions only when networked, depending on the application, this being immediately obvious from the example of the networking of an automatic gearbox closed-loop control unit to an engine closed-loop control unit.

Should a need arise to connect closed-loop control units at different sites to a distributed checking apparatus for testing, in particular to a checking apparatus consisting of multiple HIL simulators, which, by way of example, are several hundred meters or several kilometers away from one another, or could even be on different continents if applicable, then previous solutions for networking and synchronizing the computation units of the distributed checking apparatus would sometimes—depending on the distance of the computation units of the checking apparatus—fail, or severe disadvantages, in particular in regard to the accuracy of the temporal association of interactions between the closed-loop control units and the checking apparatus thereof for testing, would have to be accepted with the previous solutions for networking and synchronization.

A further problem of known checking apparatuses is that the electronic clock circuits thereof, for the most part abbreviated to "clocks", which are intended to provide a clock signal to further components of the checking apparatus, have a time drift.

Against this background, the object of the invention is to specify a checking apparatus that develops the prior art.

An advantage of the invention is that problems of the prior art that are cited at the outset are at least to some extent eliminated.

The object is achieved by a checking apparatus for testing a closed-loop control unit having the features of patent claim 1.

Advantageous configurations of the invention are the subject matter of dependent patent claims.

According to the invention, a checking apparatus 10 for testing at least one first closed-loop control unit is proposed, wherein the checking apparatus 10 comprises at least: a first computation unit Cn1 for executing a model code, the model code being able to be used to provide a simulated controlled system signal for stimulating the closed-loop control unit and to manipulate an actuator signal of the closed-loop control unit, and a first time signal converter unit 300 having at least (i) a first time signal interface G1 for picking up a first time signal Ts1 of a global time signal source, and (ii) a changeover signal transmission unit 310 configured to provide a first changeover signal Tr1 for forwarding to a first multiplexer 164, and (iii) a first timing transmission unit 312 configured to generate a first periodic timing signal Tp1 from the first time signal Ts1 and to output the first periodic timing signal Tp1 to a first PLL 191, and wherein the checking device 10 furthermore comprises:

(a) a first oscillator 161 configured to generate a second periodic timing signal Tp2 and to output the second periodic timing signal Tp2 to a second PLL 192, and (b) a first clock 166, firstly connected to the first multiplexer 164 by means of a timing signal line and secondly configured to forward a first clock signal Tc1 to a first input/output unit 171 and/or the first computation unit Cn1, wherein a first multiplexer input of the first multiplexer 164 is connected to a first PLL output of the first PLL 191 to transmit a first frequency-stabilized timing signal Tp11 in the direction of the first multiplexer 164, and wherein a second multiplexer input of the first multiplexer 164 is connected to a second PLL output of the second PLL 192 to transmit a second frequency-stabilized timing signal Tp22 in the direction of the first multiplexer 164, and wherein the first changeover signal Tr1 is provided to be used to control the first multiplexer 164 such that depending on a state of the changeover signal Tr1 the first multiplexer 164 can be used to forward either the first frequency-stabilized timing signal Tp11 or the second frequency-stabilized timing signal Tp22 to the first clock 166, and wherein the first clock 166 is configured so as, depending on the state of the changeover signal Tr1, to process either the first frequency-stabilized timing signal Tp11 or the second frequency-stabilized timing signal Tp22 to generate the first clock signal Tc1.

One of the advantages of the checking apparatus according to the invention is that it allows the first computation unit and a second computation unit to be synchronized in a comparatively simple manner despite a distance of possibly several hundred meters or even many kilometers between the computation units.

Unwanted sudden changes in the first clock signal, which "normally" changes in predefined time steps, are reducible or even entirely avoidable by means of the invention.

Where the term "synchronization" is used in this document, timing synchronization is always meant. What is known as angle synchronization is frequently based on timing synchronization. Angle synchronization is not the subject matter of the present invention, however.

The invention is explained in more detail below with reference to the drawing. Here, parts and signals of the same type are labeled with identical designations. The depicted embodiments are highly schematized.

The depiction in FIG. 1 shows a schematic view of a first embodiment of the checking apparatus 10 according to the invention for testing a closed-loop control unit, the closed-loop control unit not being depicted in FIG. 1, but rather input/output interfaces 173 connected to appropriate interfaces of the closed-loop control unit while it is being checked.

In a preferred embodiment of the checking apparatus 10, the first computation unit Cn1 and/or the first input/output unit 171 are configured to link the first clock signal Tc1 to calculated data of the first computation unit Cn1 and/or to data that have been received via the input/output interfaces 173 of the first input/output unit 171.

According to a further preferred embodiment of the checking apparatus, the first changeover signal transmission unit 310 and a time message transmission unit 314 are configured to perform a change of state for the first changeover signal Tr1 when a predefined absolute time value provided by a time message transmission unit 314 is present.

In a preferred embodiment of the apparatus according to the invention, the global time source is a time signal source of a global navigation satellite system. In this instance, it is preferred if the global navigation satellite system is consistent with the Global Positioning System (GPS) or the GLONASS or GALLILEO or BEIDOU or GAGAN or IRNSS or QZSS navigation satellite system.

The global time source preferably comprises multiple satellites.

Additionally, it should be mentioned that the known global navigation satellite systems are primarily used for position determination and navigation on Earth and in the air, but the time signals of the global navigation satellite systems are usable for further applications, as outlined in the present document.

The best-known global navigation satellite systems include:
  GPS, that is to say the "Global Positioning System" of the United States of America;
  GLONASS, that is to say the "GLObal NAvigation Satellite System" of the Russian Federation;
  Galileo of the European Union and
  Beidou of the People's Republic of China.

Full development of Beidou and Galileo is expected in the next few years.

What is known as GPS time comes from the time system of the navigation satellites of the Global Positioning System. It is consistent—apart from a slight difference of a few seconds—with international atomic time, abbreviated to TAI. In comparison with Coordinated Universal Time, called UTC, GPS time likewise differs by a few seconds.

The useful data transmitted with GPS include the present difference between GPS time and UTC being transmitted in a data field provided specifically for that purpose. GPS receivers can automatically display or provide UTC time by subtracting the appropriate number of leap seconds. GPS receivers are therefore suitable for use in a time signal converter unit 300, because these make the first time signal Ts1 of the global GPS time signal source available for the checking apparatus for further use.

The invention claimed is:

1. A checking apparatus for testing at least one first closed-loop control unit, wherein the checking apparatus comprises at least: a first computation unit for executing a model code, the model code being able to be used to provide a simulated controlled system signal for stimulating the closed-loop control unit and to manipulate an actuator signal of the closed-loop control unit, and a first time signal converter unit having at least
  (i) a first time signal interface for picking up a first time signal of a global time signal source, and (ii) a changeover signal transmission unit configured to provide a first changeover signal for forwarding to a first multiplexer, and (iii) a first timing transmission unit configured to generate a first periodic timing signal from the first time signal and to output the first periodic timing signal to a first PLL, and wherein the checking apparatus furthermore comprises:
    (a) a first oscillator configured to generate a second periodic timing signal and to output the second periodic timing signal to a second PLL, and
    (b) a first clock, firstly connected to the first multiplexer by means of a timing signal line and secondly configured to forward a first clock signal to a first input/output unit and/or the first computation unit,
wherein a first multiplexer input of the first multiplexer is connected to a first PLL output of the first PLL to transmit a first frequency-stabilized timing signal in the direction of the first multiplexer, and
wherein a second multiplexer input of the first multiplexer is connected to a second PLL output of the second PLL to transmit a second frequency-stabilized timing signal in the direction of the first multiplexer, and
wherein the first changeover signal is provided to be used to control the first multiplexer such that depending on a state of the changeover signal the first multiplexer can be used to forward either the first frequency-stabilized timing signal or the second frequency-stabilized timing signal to the first clock, and wherein the first clock is configured so as, depending on the state of the changeover signal, to process either the first frequency-stabilized timing signal or the second frequency-stabilized timing signal to generate the first clock signal.

2. The checking apparatus as claimed in claim 1, wherein the first computation unit and/or the first input/output unit is configured to link the first clock signal to calculated data of the first computation unit and/or to data that have been received via input/output interfaces of the first input/output unit.

3. The checking apparatus as claimed in claim 1, wherein the changeover signal transmission unit and a time message transmission unit are configured to perform a change of state for the first changeover signal when a predefined absolute time value provided by the time message transmission unit is present.

4. The checking apparatus as claimed in claim 2, wherein the changeover signal transmission unit and a time message transmission unit are configured to perform a change of state for the first changeover signal when a predefined absolute time value provided by the time message transmission unit is present.

* * * * *